(12) United States Patent
Liu et al.

(10) Patent No.: US 7,186,610 B1
(45) Date of Patent: Mar. 6, 2007

(54) ESD PROTECTION DEVICE FOR HIGH PERFORMANCE IC

(75) Inventors: Yowjuang (Bill) Liu, San Jose, CA (US); Cheng Huang, Cupertino, CA (US)

(73) Assignee: Altera Corporation, San Jose, CA (US)

( * ) Notice: Subject to any disclaimer, the term of this patent is extended or adjusted under 35 U.S.C. 154(b) by 150 days.

(21) Appl. No.: 10/917,699

(22) Filed: Aug. 13, 2004

(51) Int. Cl.
*H01L 21/8238* (2006.01)
(52) U.S. Cl. .................... 438/234; 438/202; 438/305
(58) Field of Classification Search ............... 438/234, 438/202, 305
See application file for complete search history.

(56) References Cited

U.S. PATENT DOCUMENTS 5,663,082 A * 9/1997 Lee ............................ 438/234

* cited by examiner

*Primary Examiner*—Long Pham
(74) *Attorney, Agent, or Firm*—Morgan, Lewis & Bockius LLP

(57) ABSTRACT

The present invention includes a circuit structure for ESD protection and methods of making the circuit structure. The circuit structure can be used in an ESD protection circuitry to protect certain devices in an integrated circuit, and can be fabricated without extra processing steps in addition to the processing steps for fabricating the ESD protected devices in the integrated circuit.

10 Claims, 9 Drawing Sheets

ESD PROTECTION DEVICE FOR HIGH PERFORMANCE IC

CROSS REFERENCE TO RELATED APPLICATIONS

The present application claims priority to U.S. application Ser. No. 10/189,919, filed Jul. 3, 2002, which application is incorporated herein by reference in its entirety.

The present application claims priority to the U.S. Provisional Application Ser. No. 60/303,335, filed Jul. 5, 2001.

FIELD OF THE INVENTION

This invention generally relates to semiconductor devices, and more specifically to methods and structures that improve electrostatic discharge (ESD) and failure robustness in modern integrated circuit (IC) devices.

BACKGROUND OF THE INVENTION

As IC design geometries continue to shrink, susceptibility to ESD damage increases. An IC may be exposed to ESD from many sources, such as automated assembly equipment and human body contact. A major source of ESD exposure for ICs is from the human body, For instance, a charge of about 0.6 µC can be induced on a human body with a body capacitance of 150 pF. When the charged human body comes in contact with the input or output pins of an IC, a discharge through the IC may result and cause damages to the IC. Such a discharge event is typically simulated using a Human Body Model (HBM), which, in one example, includes a 100–150 pF capacitor discharged through a switching component and a 1.5 kOhm series resistor into the IC.

A discharge similar to the HBM event can also occur when the IC comes in contact with a charged conductive object, such as a metallic tool or fixture. This is typically modeled by a so called machine model (MM). In one example, the MM includes a 200 pF capacitor discharged directly into the IC. The MM is sometimes referred to as the worst-case HBM.

The transfer of charge from the IC is also an ESD event. The IC may become charged, for example, from sliding down a feeder in an automated assembler. If it then contacts a metal insertion head or another conductive surface, a rapid discharge may occur from the device to the metal object. This event is typically modeled by a Charged Device Model (CDM). Because the IC itself becomes charged in a CDM event, and discharges to ground, the discharge current flows in the opposite direction in the IC as compared to that of an HBM event or MM event. Although the duration of the CDM discharge is typically very short, often less than one nanosecond, the peak current can reach several tens of amperes. Thus, the CDM discharge can be more destructive than the HBM event for some ICs.

Many commonly used ICs contain elements, such as transistors, resistors, capacitors and interconnects, that can fail when an ESD event occurs thereby affecting the quality, reliability, yield, delivery, and cost of ICs. As a result, IC product failure from ESD is an important concern in the semiconductor microelectronics industry; and undustry standards require that IC products withstand a minimum level of ESD. To meet this requirement, ESD protection circuitry is generally built into the input, output, and/or power supply circuits of an IC.

The ability to produce workable ESD protection structures depends upon the interrelationship of the IC's topology, the design layout, the circuit design, and the fabrication process. Various circuit designs and layouts have been proposed and implemented for protecting ICs from ESD. One common ESD protection scheme used in metal-oxide-semiconductor (MOS) ICs relies on parasitic bipolar transistors associated with MOS devices in the ESD protection circuitry, such as an n-type MOS (NMOS) device whose drain is connected to the pin to be protected and whose source is tied to ground. The protection level or failure threshold can be adjusted by varying the length of the NMOS device.

One method used to improve ESD protection offered by the MOS device is to bias the substrate of an ESD protection circuit on an IC. Substrate biasing can be effective at improving the response of a single or multi-finger MOS transistor that is used to conduct an ESD discharge to ground. Nevertheless, substrate biasing can also cause the threshold voltages of other devices in the IC to change from their nominal values and thus affect device operation. In addition, substrate biasing under steady-state conditions generates heat and increases power losses.

Another common approach to improve ESD protection is to add an ESD implant in the MOS device in the ESD protection circuitry. However, conventional ESD implants, such as deep p-type implants under an n-type source or drain region, can significantly increase the input or output junction capacitance and source-drain resistance, degrading circuit performance. Furthermore, the addition of the ESD implant requires additional process steps, thereby increasing manufacturing costs, time and room for error.

Therefore, there is a need for an ESD protection circuitry offering sufficient ESD protection without the problems of heating, power losses, and device malfunction associated with existing substrate biasing circuits. There is also a need for an ESD protection circuitry that offers sufficient ESD protection without extra manufacturing steps. Furthermore, there is a need for an ESD protection circuitry that provides sufficient ESD protection without the degradation in circuit performance associated with conventional approaches.

SUMMARY OF THE INVENTION

The present invention meets the above need by providing a simple ESD protection structure for use in an ESD protection circuitry and methods of making the ESD protection structures. The ESD protection structure can be used to provide sufficient ESD protection to most complementary MOS (CMOS) ICs without the trade-offs of conventional approaches. In one aspect of the present invention, the ESD protection structure constitutes a reliable discharge path and is fabricated on a substrate without the need for processing steps other than those required for fabricating the CMOS ICs.

In one embodiment of the present invention, in an integrated circuit fabricated on a semiconductor substrate, an ESD protection circuit protects one or more semiconductor devices in the integrated circuit from damage caused by an ESD pulse. The ESD protection circuit comprises a first diffusion region having a first conductivity type formed at a surface of the semiconductor substrate. One or more contacts in the first diffusion region provides connection of the first diffusion region to the region where the ESD pulse accumulates. The ESD protection circuit also comprises a second diffusion region formed at the surface of the semiconductor substrate. The second diffusion region is adjacent to the first diffusion region and is of a second conductivity type opposite to the first conductivity type.

In an example of the present invention, the first diffusion region is the n-type source or drain region of one or more NMOS transistors. The source or drain region has one or more notches at its edges, or holes or openings in the middle of it, and the second diffusion region, a p-type diffusion region, occupies the notches or holes or openings of the n-type source or drain region. As a result, a pn junction is formed between the first diffusion region and the second diffusion region. In response to an ESD pulse received at the first diffusion region through the contacts, the pn junction breaks down earlier than the source or drain junctions in the protected semiconductor devices. The breakdown of the pn junction triggers one or more parasitic bipolar transistors associated with the one or more NMOS transistors, causing discharge current to flow through the bulk of these transistors thereby discharging the ESD pulse.

Alternatively, the first diffusion region can be the p-type source or drain region of one or more PMOS transistors and the second diffusion region, being n-type, occupies the notches or holes or openings of the p-type source or drain region. Again, a pn junction is formed between the first diffusion region and the second diffusion region and operates to trigger one or more parasitic bipolar transistors associated with the one or more PMOS transistors, discharging the ESD pulse received at the first diffusion region.

The present invention also provides several technical advantages. One important technical advantage of the present invention is that it provides sufficient protection from various ESD sources. For instance, the ESD protection circuitry of the present invention is effective to protect the IC from the HBM, MM or CDM and other ESD events. The present invention also offers better scalability and layout efficiency.

BRIEF DESCRIPTION OF THE DRAWINGS

For a more complete understanding of the present invention and advantages thereof, reference is now made to the following description taken in conjunction with the accompanying drawings, in which.

DETAILED DESCRIPTION OF THE INVENTION

Figure 1:
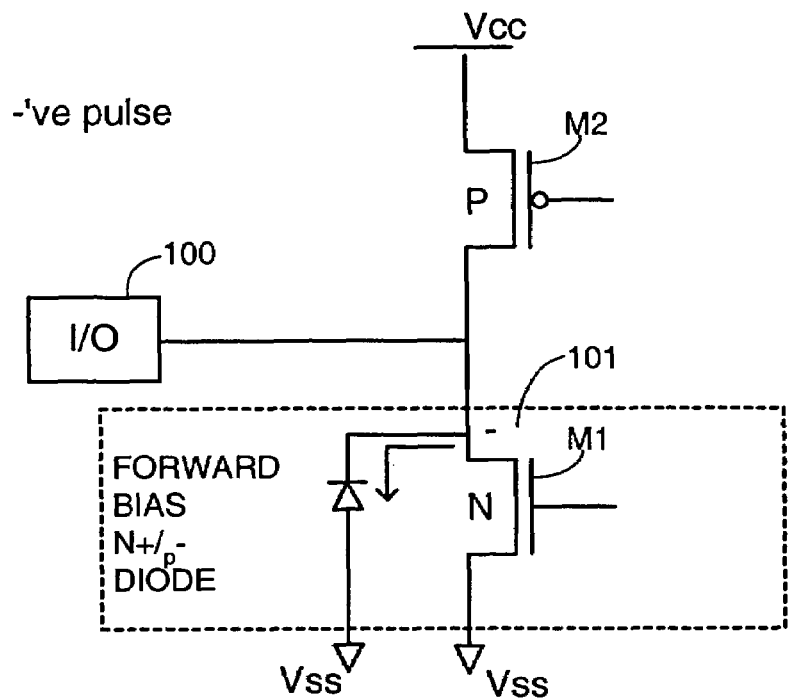
FIG. 1 is a schematic diagram of an embodiment of an ESD protection circuit showing a discharge path for a negative ESD pulse.
Figure 2:
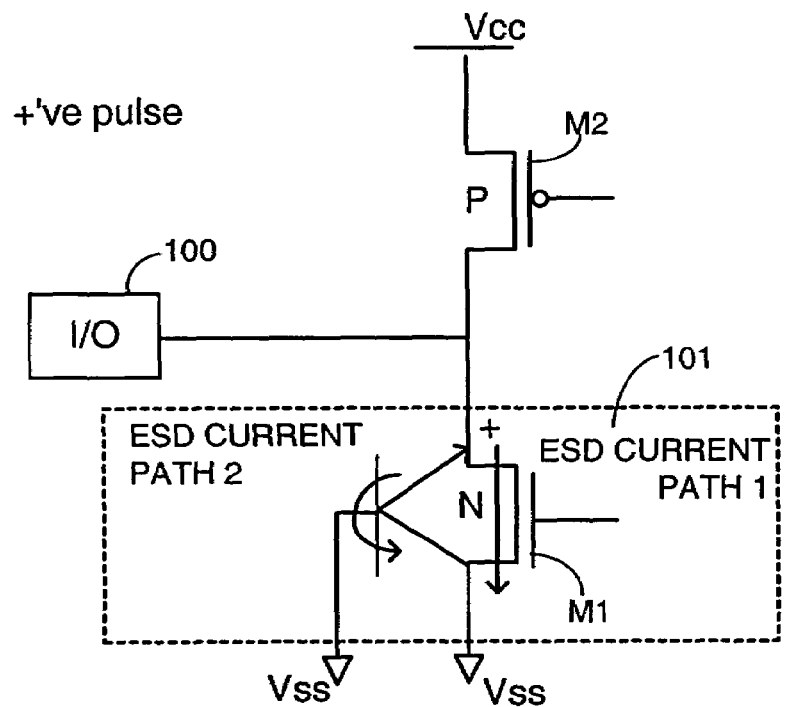
FIG. 2 is a schematic diagram of an embodiment of an ESD protection circuit showing a discharge path for a positive ESD pulse.

The figures referred to herein are for illustrative purposes only and are not to scale or conform in shape with real devices. The present invention includes device structures and methods of making the device structures to be included in an ESD protection circuitry that protects one or more devices in the IC from ESD damages. The ESD protected devices are devices associated with the normal operations of the IC. FIG. 1 and FIG. 2 are schematic circuit diagrams representing a conventional IC having an ESD protection circuit structure 101 for bypassing an ESD pulse in an IC. ESD protection structure 101 protects devices such as pad 100 and MOS transistor M2 connected to pad 100 from ESD damages caused by the ESD pulse. The ESD protected device M2 can be a PMOS or NMOS transistor. In practice, each IC typically includes millions of NMOS and/or PMOS transistors and hundreds of I/O pads 100. As shown in FIG. 1, ESD protection circuit structure 101 comprises MOS transistor M1. A MOS transistor typically includes two diffusion regions of a same conductivity type on two sides of a gate. Depending on how the MOS transistor is connected in a circuit, one of the two diffusion regions is typically referred to as a source region while the other diffusion regions is referred to as a drain region. In the example shown in FIG. 1, MOS transistor M1 is a NMOS transistor with its source connected to a $V_{SS}$ pin of the IC and its drain connected to I/O pad 100, and to M2, which is a PMOS transistor. Transistor M1 provides a discharge path between pad 100 and the $V_{SS}$ pin for bypassing an ESD pulse that accumulates at pad 100. FIG. 1 also shows that, in an exemplary operation, for a voltage pulse that is negative with respect to $V_{SS}$, the voltage pulse is discharged through the substrate of the IC to a $V_{SS}$ pin of the IC.

As shown in FIG. 2, when the ESD pulse is positive with respect to $V_{SS}$, there are different conduction paths for discharging the pulse through transistor M1. One conduction path. i.e., ESD current path 1 in FIG. 2, is a surface path through the channel of transistor M1. Another conduction path, i.e., ESD current path 2 in FIG. 2, is through the bulk of the transistor. The ESD current path through the bulk is preferred over the surface path. Illustratively, an ESD implant is used to reduce the n-type drain junction breakdown voltage of M1. With the ESD implant, the drain junction breaks down earlier in response to a positive ESD pulse, triggering the parasitic bulk bipolar transistor associated with M1 to turn on to allow most ESD current to pass through the bulk.

Figure 3A:
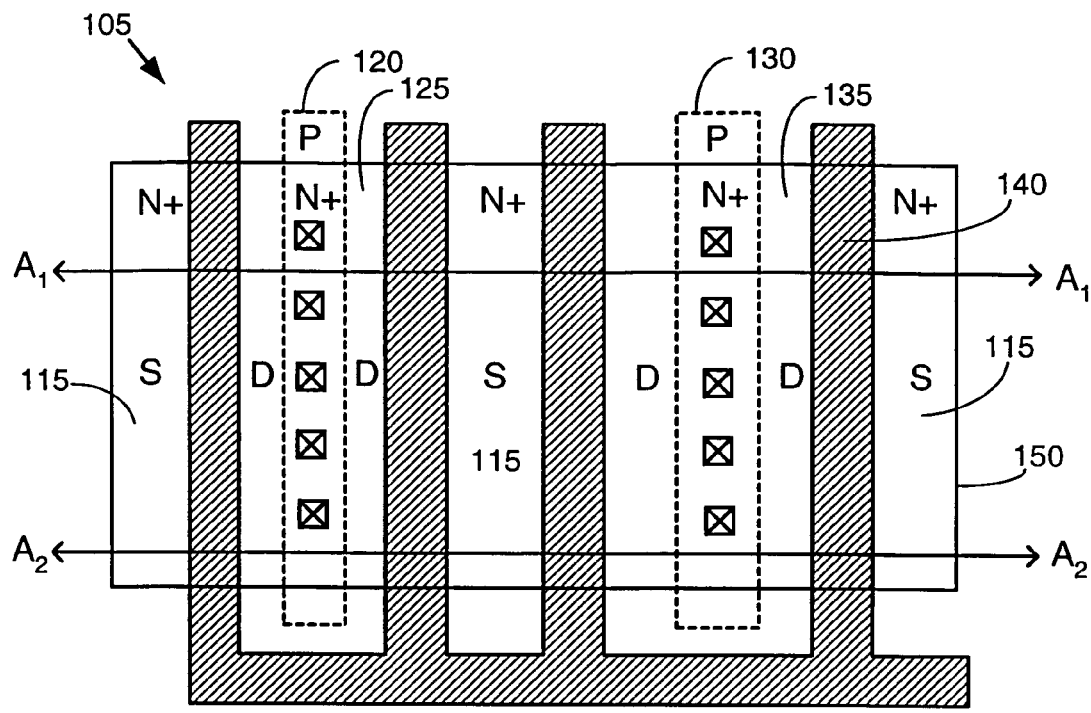
FIGS. 3A–3C are block diagrams illustrating in layout and vertical cross sections a prior art ESD protection circuit structure employing an ESD implant.
Figure 3B:
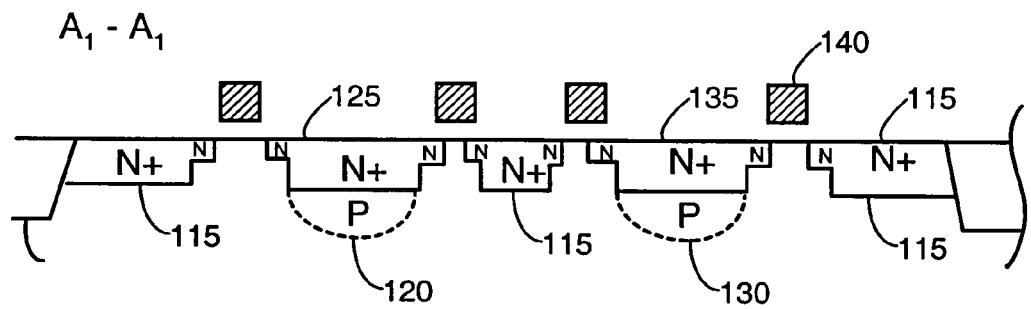
Figure 3C:
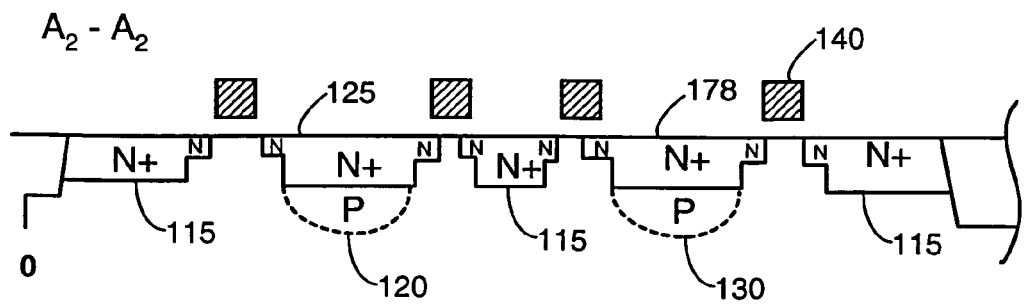

A conventional way of providing an ESD implant is to add a deep p-type implant or diffusion region under the n-type drain region of a NMOS transistor in an ESD protection circuit, as shown in FIGS. 3A, 3B and 3C. FIG. 3A depicts a layout of a NMOS transistor 105 having N+ source regions 115, and N+ drain regions 125, 135 within an active area 150 and finger-shaped gates 140. P-type implants 120, 130 are formed underneath the entire width of N+ drain regions 125, 135. FIGS. 3B and 3C depict vertical cross sections of transistor 105 along lines $A_1$—$A_1$ and $A_2$–$A_2$, respectively, in FIG. 3A. Because implants 120 and 130 under the n+ drain diffusion region 125 and 135, respectively, extend across the entire width of active area 150 of transistor 105, as shown in FIG. 3A, these implants significantly increase the source-drain resistance of the transistor 105 and the junction capacitance seen by pad 100. The increased capacitance and resistance degrades circuit performance. Additionally, since the representative ESD implant regions 120 and 130 are deep p-type implants under n+ drain regions 125 and 135, these implants require additional processing steps that increase manufacturing costs and time, as explained below.

Figure 4A:
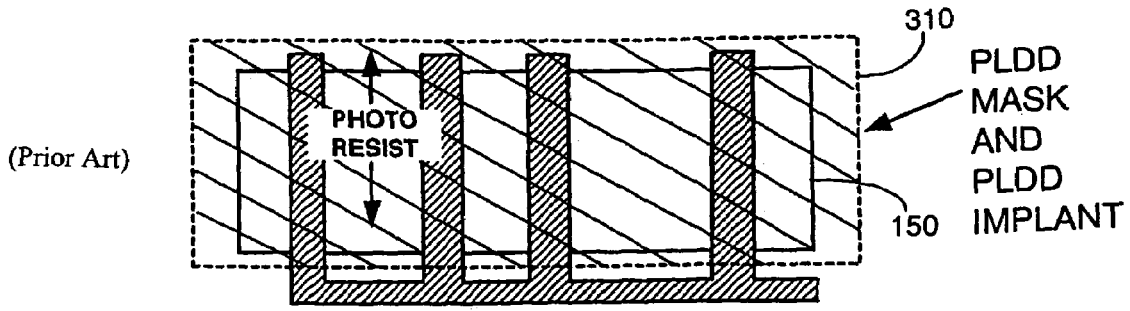
FIGS. 4A–4D are block diagrams illustrating some prior art masking steps involved in the fabrication of an ESD protection circuit.
Figure 4B:
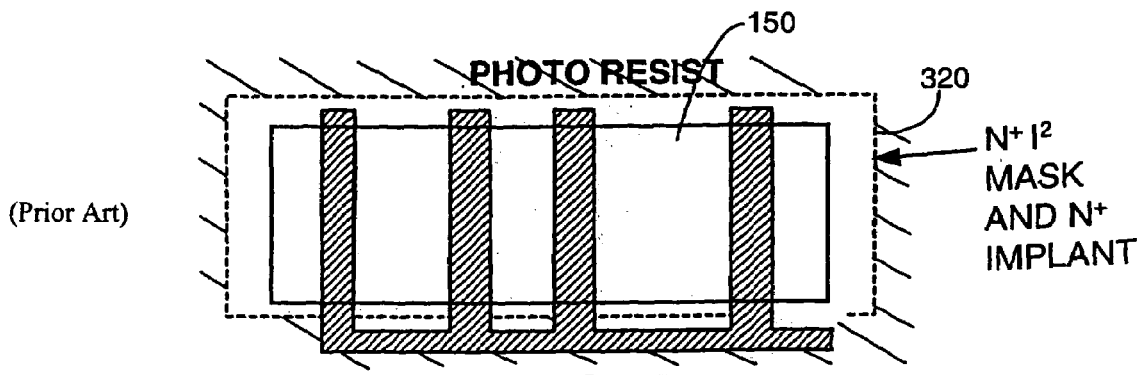

FIGS. 4A–D illustrate some of the masking steps involved in fabricating NMOS transistor 105 on a semiconductor substrate using a conventional ESD implant approach. It will be understood by those skilled in the art that in conventional technology numerous such transistors are formed at the same time in each IC being made. As shown in FIG. 4A, a photo resist mask 310 covers the active area 150 of each NMOS transistor 105 to be formed in the substrate while the substrate undergoes a p-type lightly doped drain (PLDD) ion implant process for forming PLDD diffusion regions of one or more PMOS transistors elsewhere in the IC. The mask prevents implantation of p-type ions in the active area of the NMOS transistors. Later, the active area 150 of each NMOS transistor 105 is exposed while surrounding areas are covered by mask 320 as shown in FIG. 4B; and the substrate undergoes a N+ or N++ implant for forming source/drain diffusion regions of each NMOS transistor 105 of the IC. Prior to or later than the N+ or N++ implant, a P+ or P++ implant for forming source/drain regions of one or more PMOS transistors (not shown) of the IC is performed on the substrate while active area 150 of each NMOS transistor 105 is covered by mask 330 shown in FIG. 4C. ESD implant regions 120 and 130 are formed under the n+ drain regions of the NMOS transistor with a separate implant process using mask 340 shown in FIG. 4D. This mask covers a large part of active area 150 and surrounding areas but exposes areas 341 and 342 for deep p-type implants under n+ drain regions 125 and 135, respectively. As stated above, the extra processing steps associated with the ESD implant and corresponding masking steps increase manufacturing costs and time.

Figure 5A:
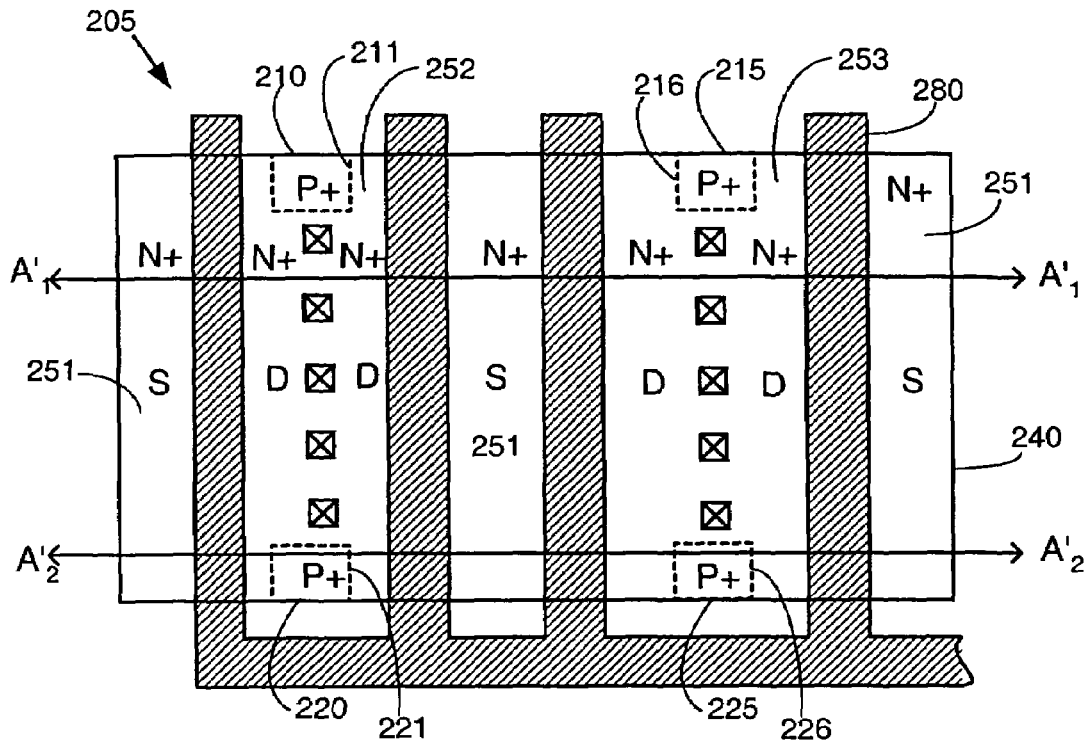
FIGS. 5A–5C are block diagrams illustrating in layout and vertical cross sections an ESD protection circuit structure employing an ESD implant according to one embodiment of the present invention.
Figure 5B:
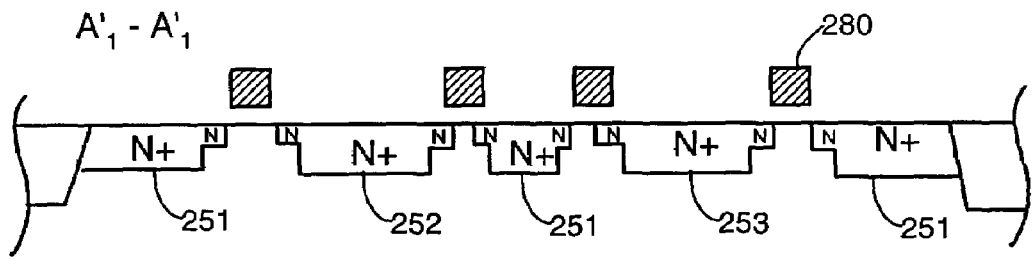
Figure 5C:
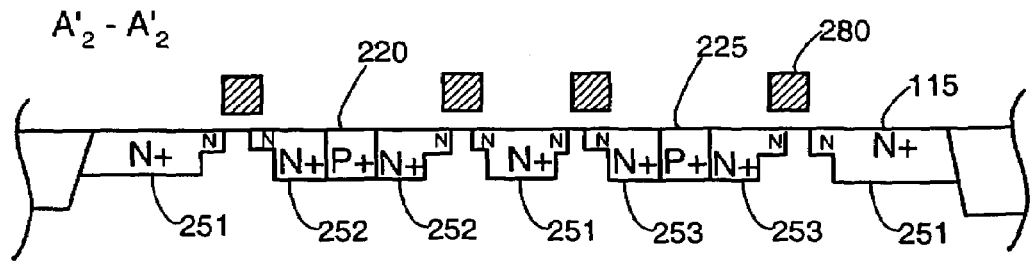

The present invention avoids the aforementioned drawbacks of conventional ESD implant approaches. FIG. 5A depicts a layout of a MOS transistor 205 for use in a ESD protection structure, such as structure 101 in FIGS. 1 and 2, according to one embodiment of the present invention. FIGS. 5B and 5C depict vertical cross sections of transistor 205 along lines $A_1'$—$A_1'$ and $A_2'A_2'$, respectively, in FIG. 5A. Illustratively, MOS transistor 205 is referred to hereafter as a NMOS transistor having finger-shaped gates 280, n-type (N+ or N++) source regions 251, and n-type (N+ or N++) drain regions 252, 253 within an active area 240. But those of ordinary skill in the art will recognize that the description below can be applied with slight modification to a PMOS transistor in any ESD protection structure. Also, depending on how the MOS transistor 205 is connected in a circuit, diffusion regions 252 and 253 can be source regions and diffusion regions 251 can be drain regions.

As shown in FIG. 5A, n-type drain regions 252 and 253 of NMOS transistor 205 have notches 211, 216, 221 and 226 at their respective edges, and ESD implants 210, 215, 220, and 225 are formed at the surface of substrate 200 and occupy the notches adjacent to the respective n-type drain regions. In this way, sufficient ESD protection is provided by the implants 210, 215, 220, and 225 without the implants having to extend substantially across the active area 240 of transistor 205. Thus, a substantial portion of transistor 205 is unaffected by the ESD implants 210, 215, 220, and 225.

Also, as shown in FIG. 5C, because the ESD implants 210, 215, 220 and 225 are not under n-type drain diffusion regions 251 or 253 but are adjacent to the n-type drain diffusion regions, and because the depths of the ESD implants 210, 215, 220 and 225 are not significantly greater than the n-type diffusion regions 251 and 253, the present invention offers a simpler structure than traditional ESD implant approaches. The simplified structure requires a less complicated fabrication process to achieve sufficient ESD protection for the IC. For example, the ESD implants 210, 215, 220 and 225 can be formed using one or more implant steps already used in the fabrication of conventional IC strucutres, as explained in more detail below.

Figure 5D:
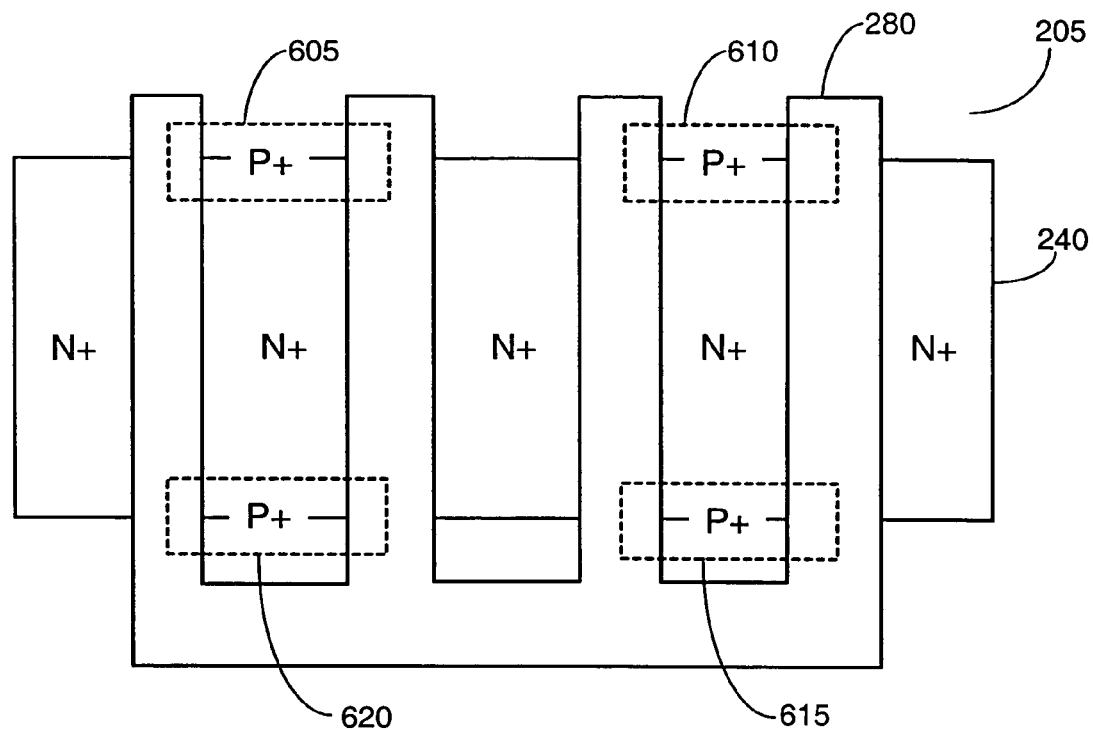
FIG. 5D is a block diagram illustrating a layout of an ESD protection circuit structure employing an ESD implant according to an alternative embodiment of the present invention.
Figure 5E:
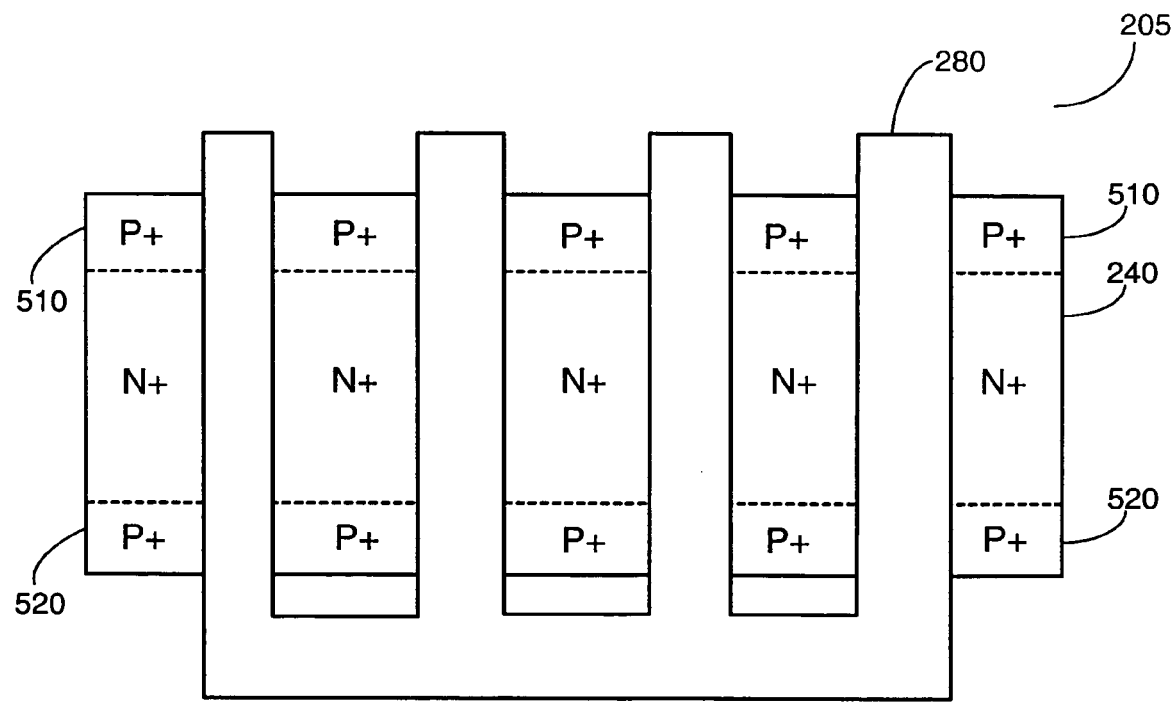
FIG. 5E is a block diagram illustrating a layout of an ESD protection circuit structure employing an ESD implant according to another alternative embodiment of the present invention.

The shape and size of the notches 211, 216, 221 and 226 and the corresponding ESD implant regions can be varied without departing from the spirit and scope of the present invention. For example, FIG. 5D shows that the notches can be extended along the edges of the active area and across the length of the n-type diffusion regions 251 and 253 to form larger implant region 605, 610, 615, and 620, respectively. Alternatively, as shown in FIG. 5E, the ESD implant regions 210 and 215 can be extended until they merge into a single region 510 and the ESD implant regions 220 and 225 can be extended to merge into a single region 520. Since both regions 510 and 520 extend laterally across the length of active region 240, there is less concern about aligning the ESD implants with gate 280. This is very useful when the spacings between conductive fingers of the gate 280 are very small.

Furthermore, ESD implants 210, 215, 220, and 225 can occupy holes or openings in the middle of n-type diffusion regions 251 and 253 instead of notches at the edges of the n-type diffusion regions 251 and 253.

Figure 6A:
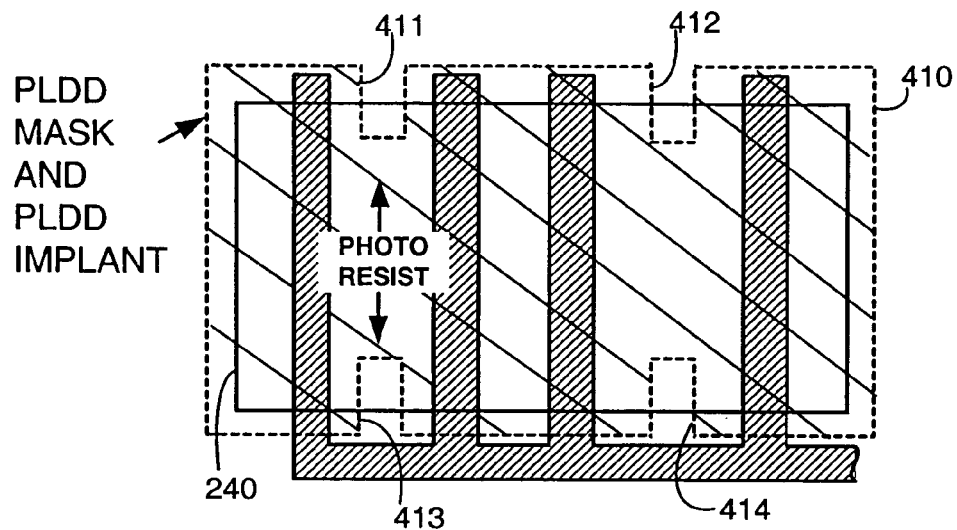
FIGS. 6A–6C are block diagrams illustrating some masking steps involved in the fabrication of an ESD protection circuit according to an embodiment of the present invention.
Figure 6B:
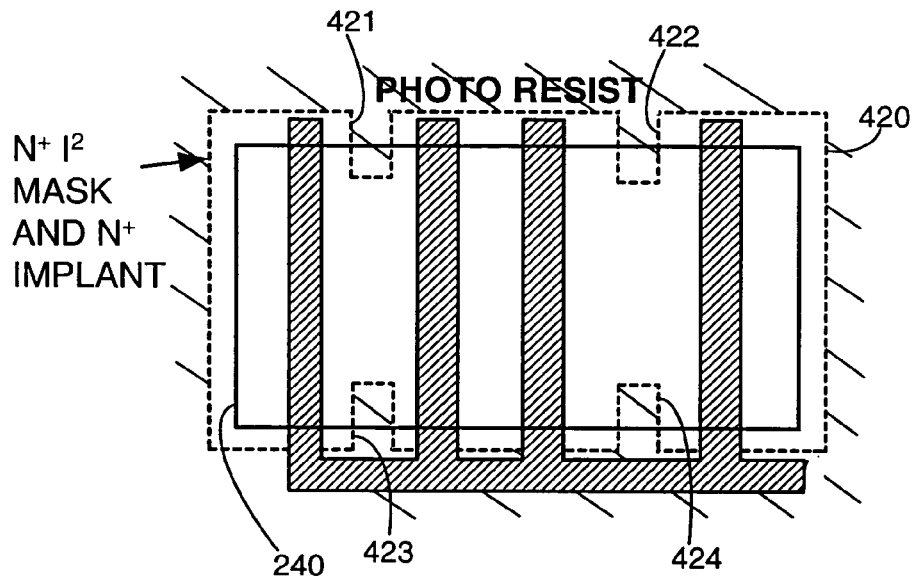
Figure 6C:
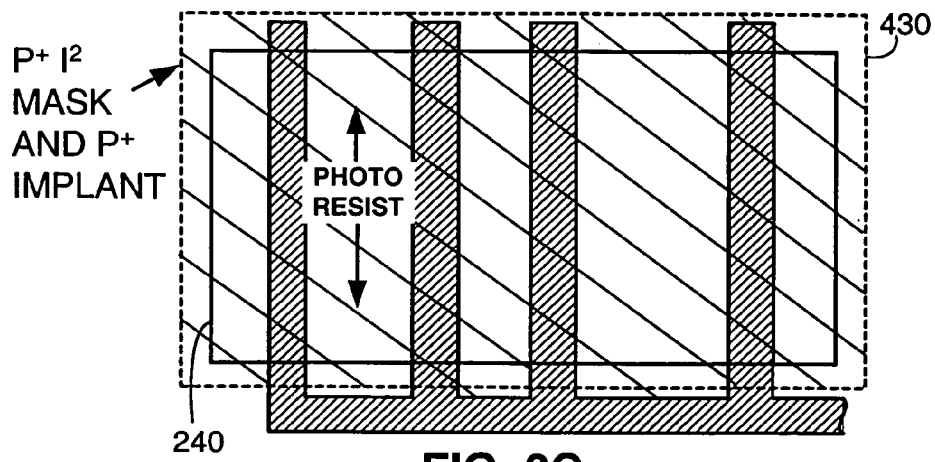
Figure 6D:
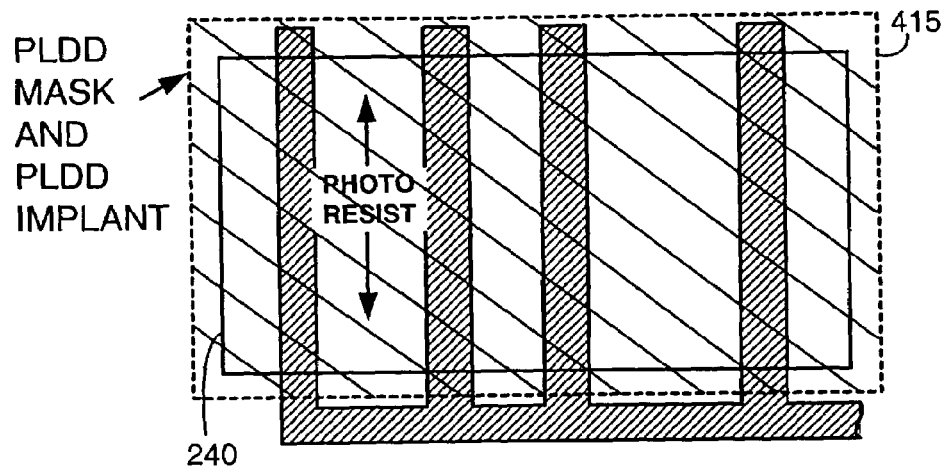
FIGS. 6D–6F are block diagrams illustrating some masking steps involved in the fabrication of an ESD protection circuit according to an alternative embodiment of the present invention.
Figure 6E:
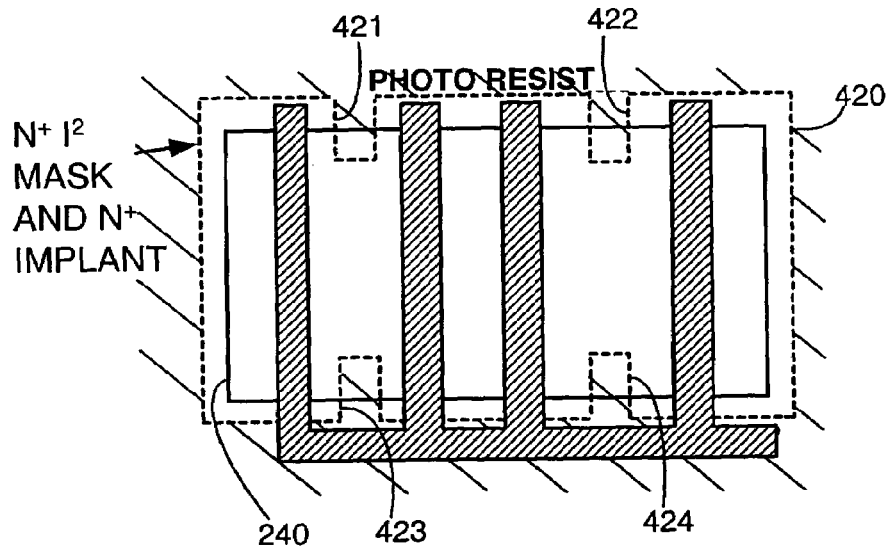
Figure 6F:
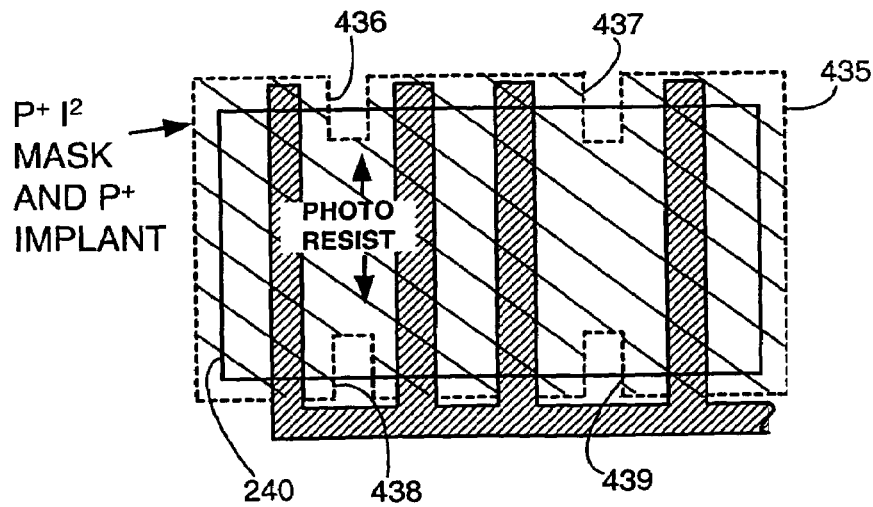

FIGS. 6A–C illustrate some of the masking steps involved in fabricating NMOS transistor 205 on a semiconductor substrate, according to one embodiment of the present invention. Again, it will be understood that numerous such transistors are formed at the same time in each IC being made. As shown in FIG. 6A, a photo resist mask 410 covers most of the active area 240 of each NMOS transistor 205 to be formed in the substrate while the substrate undergoes a PLDD implant process for forming PLDD diffusion regions of one or more PMOS transistors elsewhere in the IC. This mask prevents implantation of p-type ions wherever the mask covers the active area. Mask 410 has notches or openings 411, 412, 413, and 414 for allowing the PLDD implant process to implant p-type ions in the underlying portions of active area 240 to form ESD implant regions 210, 215, 220, and 225, respectively. Later, as depicted in FIG. 6B, most of active area 240 of each NMOS transistor 205 is exposed while surrounding areas are covered by mask 420 when the substrate undergoes a N+ or N++ implant for forming source/drain diffusion regions of each NMOS transistor 205 of the IC. Mask 420 has bumps 421, 422, 423, and 424 corresponding to notches 411, 412, 413, and 414 of mask 410, respectively. Bumps 421, 422, 423, and 424 cover portions of active area 240 corresponding to the ESD implant regions 210, 215, 220, and 225 during the N+ or N++ source/drain implant. As will be apparent from a comparison of FIGS. 6A and 6B, the area of the active region covered by mask 420 is the complement of the area covered by mask 410. Prior to or later than the N+ or N++ implant, a P+ or P++ implant for forming source/drain regions of one or more PMOS transistors (not shown) of the IC is performed on the substrate while the active area of each NMOS transistor 205 is covered by mask 430 in FIG. 6C.

FIGS. 6 D–F illustrate some of the masking steps involved in fabricating a NMOS transistor 205, according to an alternative embodiment of the present invention. Again, numerous such transistors are formed at the same time. As shown in FIG. 6D, a photo resist mask 415 covers active area 240 of each NMOS transistor 205 while the substrate undergoes a PLDD implant process for forming PLDD diffusion regions of one or more PMOS transistors elsewhere in the IC. Later, most of active area 240 of each NMOS transistor 205 is exposed while surrounding areas are covered by mask 420 as shown in FIG. 5B when the substrate undergoes a N+ or N++ implant for forming source/drain diffusion regions of each NMOS transistor 205 of the IC. Mask 420 has bumps 421, 422, 423, and 424 that cover portions of active area 240 corresponding to ESD implant regions 210, 215, 220, and 225 during the N+ or N++ source/drain implant. Prior to or later than the N+ or N++ implant, a P+ or P++ implant for forming source/drain regions of one or more PMOS transistors (not shown) of the IC is performed on the substrate while most of the active area of each NMOS transistor 205 is covered by mask 435 in FIG. 6F. Mask 435 has notches 436, 437, 438, and 439 for allowing the P+ or P++ source/drain implant into portions of active area 240 to form ESD implant regions 210, 215, 220, and 225, respectively. Because the P+ or P++ source/drain implant forms diffusion regions with higher dopant concentrations than the PLDD implant, the ESD implant regions 210, 215, 220, and 225 formed using the masking steps in FIGS. 6D–F have higher p-type dopant concentrations that those formed using the masking steps in FIGS. 6A–C. Thus, the ESD protection structure 101 fabricated using the masking steps in FIGS. 6D–F offers a higher level of ESD protection than the ESD protection structure fabricated using the masking steps in FIGS. 6A–C.

Figure 6G:
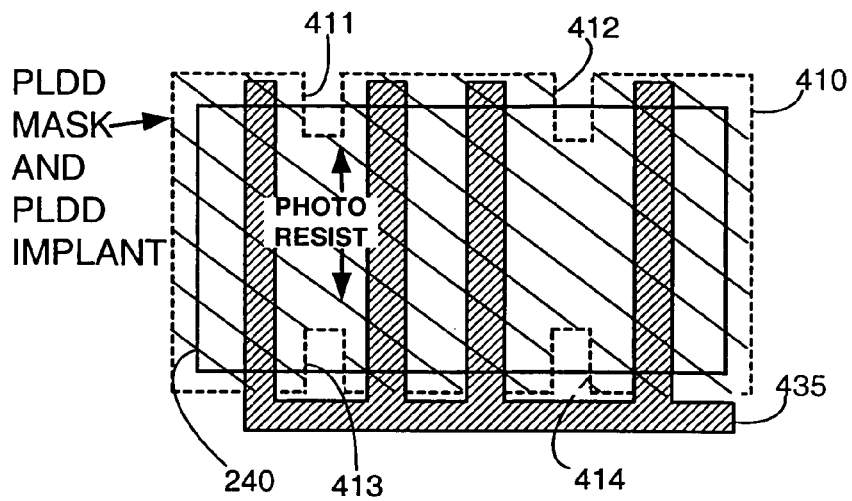
FIGS. 6G–6I are block diagrams illustrating some masking steps involved in the fabrication of an ESD protection circuit according to another alternative embodiment of the present invention.
Figure 6H:
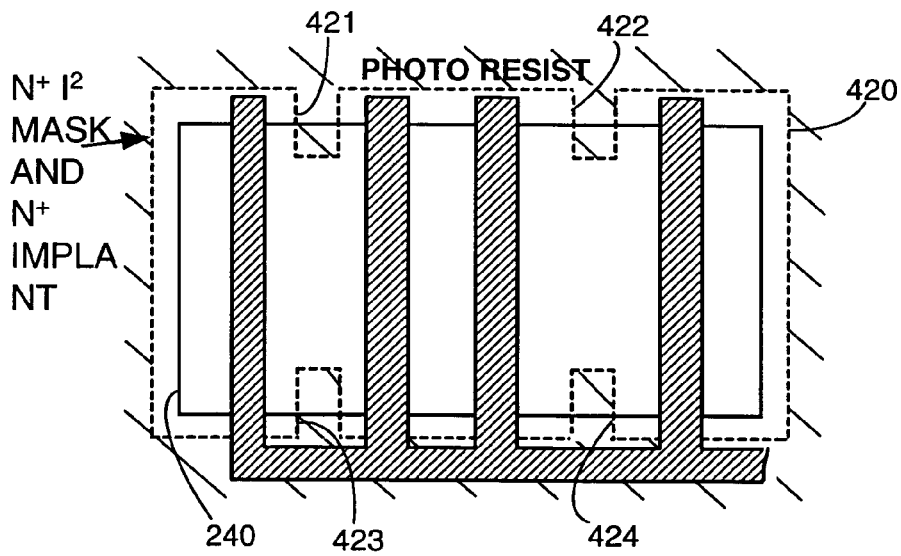
Figure 6I:
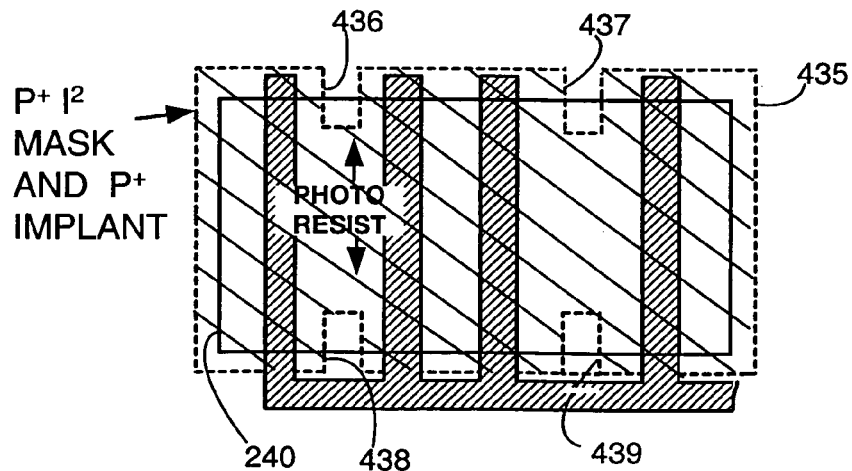

In yet another embodiment of the present invention, both the PLDD implant and the P+ or P++ source/drain implant can be used to form the ESD implant regions 210, 215, 220, and 225, as shown in FIGS. 6G–I.

Thus, according to the embodiments of the present invention, there is no need for additional implant and associated masking steps for forming the ESD implants. The ESD implants can be formed using process steps necessary for forming one or more diffusion regions of one or more ESD protected devices of the IC, resulting in reduced manufacturing costs and lower possibilities of device fabrication defects.

Figure 4C:
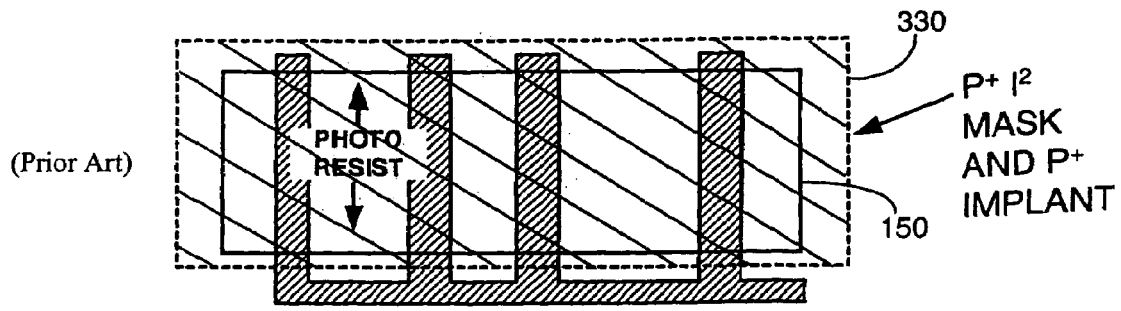
Figure 4D:
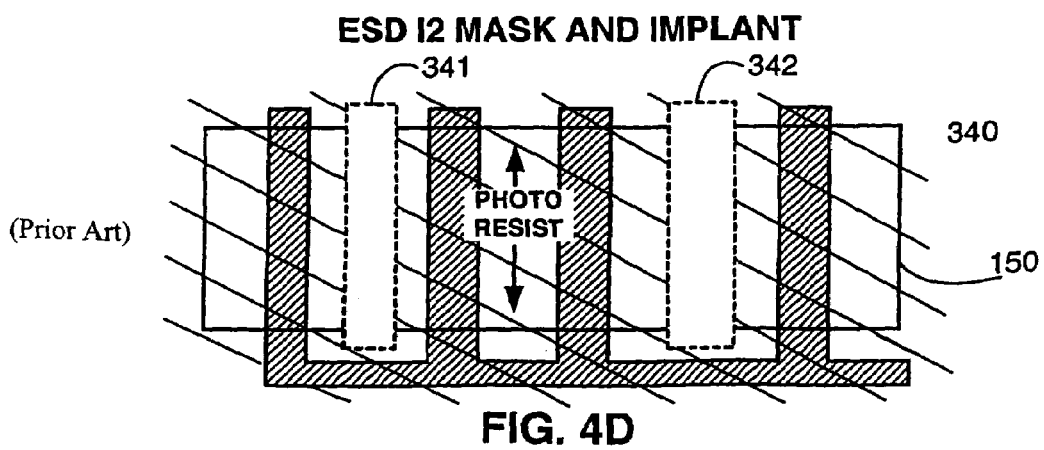
Figure 7:
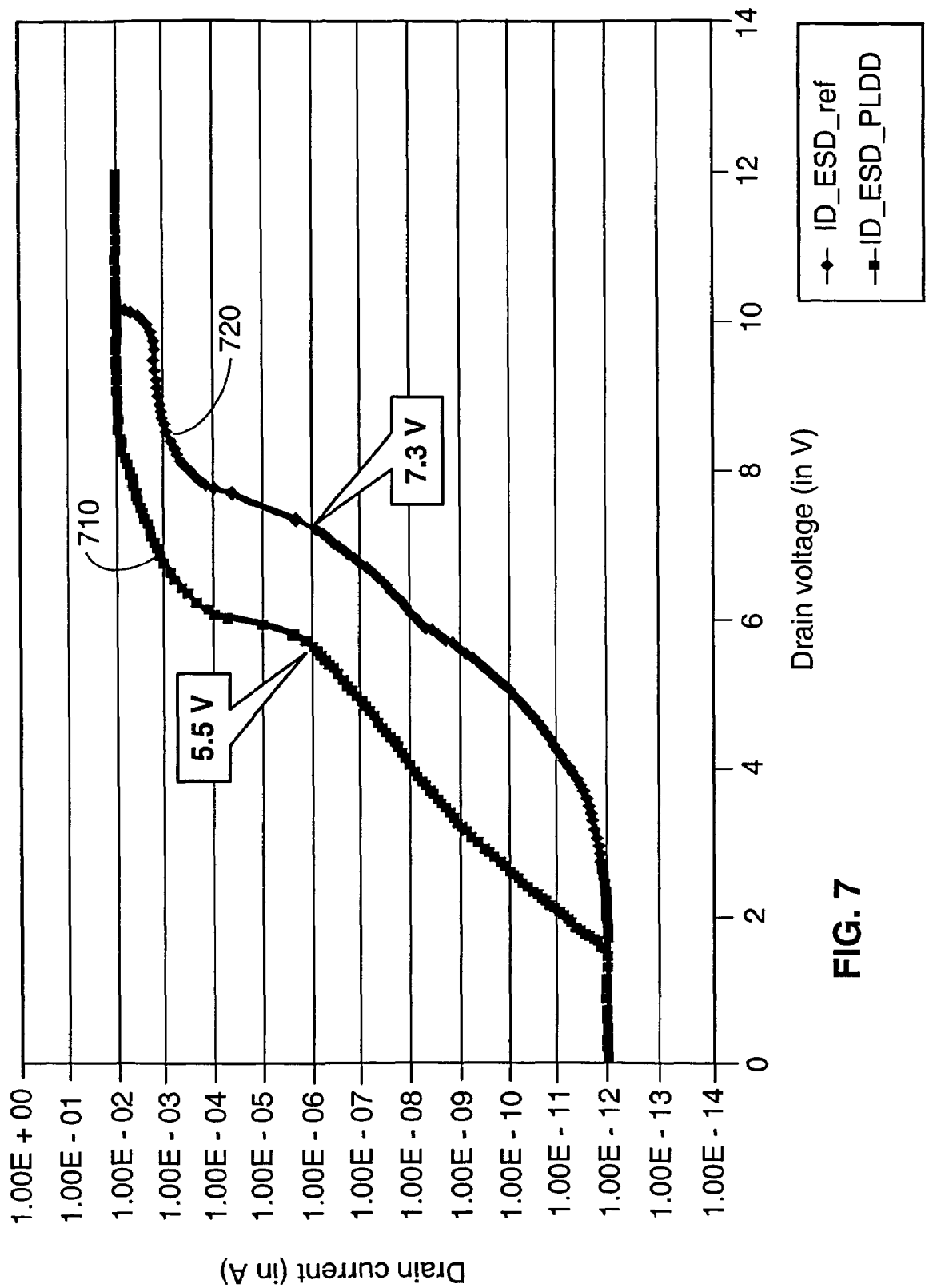
FIG. 7 are plots of experimental data graphically illustrating an improvement realized by an ESD device fabricated in accordance with an embodiment of the present invention.

FIG. 7 graphically compares ESD breakdown voltages of two NMOS transistors employing ESD implants, one fabricated using an embodiment of the present invention, such as the one involving masking steps shown in FIGS. 6A–C (curve 710), and another fabricated using prior art approaches as shown in FIGS. 4A–C (curve 720). Curve 710 shows that the NMOS transistor with ESD implants fabricated using an embodiment of the present invention breaks down when the drain voltage is about 5.5 volts. Curve 720 shows that the NMOS transistor with ESD implants fabricated using the conventional approach breaks down when the drain voltage is about 7.3 volts. Therefore, the present invention is superior to the conventional approaches by providing an almost 2 volt reduction in ESD breakdown voltage.

Although the present invention has been described in detail, it should be understood that various changes, substitutions, and alterations can be made hereto without departing from the spirit and scope of the invention as defined by the appended claims.

We claim:

1. A method of fabricating an ESD protection structure on a semiconductor substrate, said ESD protection structure protecting one or more semiconductor devices in an integrated circuit from ESD damage, comprising:

forming a first mask for said substrate, said first mask covering most of an active area of a semiconductor device while leaving open one or more edge portions of said active area, said edge portions defining areas for ESD implants;

implanting dopants of a first dopant type into said areas for ESD implants;

forming a second mask for said substrate, said second mask covering said edge portion of said active area while leaving open a large portion of said active area; and implanting into said large portion of said active area dopants of a second dopant type, said second dopant type being opposite to said first dopant type.

2. The method of claim 1 wherein implanting dopants of a first dopant type into said areas for ESD implants is performed during lightly doped drain implant process for forming one or more lightly doped drain regions of said semiconductor devices in said integrated circuit.

3. The method of claim 1 wherein implanting dopants of a first dopant type into said areas for ESD implants is performed during a source/drain implant process for forming one or more source/drain regions of said semiconductor devices in said integrated circuit.

4. A method of fabricating an ESD protection structure on a semiconductor substrate, said ESD protection structure protecting one or more semiconductor devices in an integrated circuit from ESD damage, comprising:

forming a first mask for said substrate, said first mask covering most of an active area of a semiconductor device while leaving open one or more edge portions of said active area, said edge portions defining areas for ESD implants;

implanting dopants of a first dopant type into said areas for ESD implants;

forming a second mask for said substrate, said second mask covering said edge portion of said active area while leaving open a large portion of said active area;

implanting into said large portion of said active area dopants of a second dopant type, said second dopant type being opposite to said first dopant type;

forming a third mask for said substrate, said third mask covering most of the active regions of the semiconductor device while leaving open the edge portions left open by the first mask; and implanting dopants of a first dopant type into said areas for ESD implants.

5. The method of claim 4 wherein implanting dopants of a first dopant type into said areas for ESD implants is first performed during a lightly doped drain implant process for forming one or more lightly doped drain regions of said semiconductor devices in said integrated circuit and is later performed during a source/drain implant process for forming one or more source/drain regions of said semiconductor devices in said integrated circuit.

6. The method of claim 1 wherein the portion of the active area covered by the second mask is the complement of the portion of the active area covered by the first mask.

7. A method of fabricating an ESD protection structure on a semiconductor substrate, said ESD protection structure protecting one or more semiconductor devices in an integrated circuit from ESD damage, comprising:
   forming a first mask for said substrate, said first mask covering one or more edge portions of an active area of a semiconductor device while leaving a large portion of said active area open, said edge portions defining areas for ESD implants;
   implanting dopants of a first conductivity type in said large portion of said active area;
   forming a second mask for said substrate, said second mask covering said large portion of said active area but not said edge portions; and
   implanting dopants of a second conductivity type into said areas for ESD implants.

8. The method of claim 7 wherein implanting dopants of a second dopant type into said areas for ESD implants is performed during a lightly doped drain implant process for forming one or more lightly doped drain regions of said semiconductor devices in said integrated circuit.

9. The method of claim 7 wherein implanting dopants of a second dopant type into said areas for ESD implants is performed during a source/drain implant process for forming one or more source/drain regions of said semiconductor devices in said integrated circuit.

10. The method of claim 7 wherein the portion of the active area covered by the second mask is the complement of the portion of the active area covered by the first mask.

* * * * *